(12) United States Patent
Furuta

(10) Patent No.: US 8,913,377 B2
(45) Date of Patent: Dec. 16, 2014

(54) SERVER RETENTION MECHANISM

(75) Inventor: Steven J. Furuta, Santa Clara, CA (US)

(73) Assignee: Facebook, Inc., Menlo Park, CA (US)

( * ) Notice: Subject to any disclaimer, the term of this patent is extended or adjusted under 35 U.S.C. 154(b) by 395 days.

(21) Appl. No.: 13/029,443

(22) Filed: Feb. 17, 2011

(65) Prior Publication Data
US 2012/0212893 A1    Aug. 23, 2012

(51) Int. Cl.
   G06F 1/16    (2006.01)
   H05K 5/00    (2006.01)
   H05K 7/00    (2006.01)
   H05K 7/14    (2006.01)

(52) U.S. Cl.
   CPC .................................. H05K 7/1489 (2013.01)
   USPC ................................................. 361/679.33

(58) Field of Classification Search
   CPC .............................. G06F 1/187; G11B 33/124
   USPC ......................... 361/679.33–679.39, 724–727
   See application file for complete search history.

(56) References Cited

U.S. PATENT DOCUMENTS

| | | | | |
|---|---|---|---|---|
| 4,696,449 A | * | 9/1987 | Woo et al. | 248/553 |
| 5,211,459 A | * | 5/1993 | Wu | 312/223.2 |
| 5,788,211 A | * | 8/1998 | Astier | 248/674 |
| 6,141,222 A | * | 10/2000 | Toor et al. | 361/726 |
| 6,292,359 B1 | * | 9/2001 | Boe | 361/679.58 |
| 6,416,031 B1 | * | 7/2002 | Billman | 248/694 |
| 6,775,132 B2 | * | 8/2004 | Chen et al. | 361/679.33 |
| 6,798,652 B2 | * | 9/2004 | Wang et al. | 361/679.33 |
| 6,909,047 B2 | * | 6/2005 | Zhang | 174/50 |
| 6,956,737 B2 | * | 10/2005 | Chen et al. | 361/679.39 |
| 7,054,153 B2 | * | 5/2006 | Lewis et al. | 361/679.33 |
| 7,113,409 B1 | * | 9/2006 | Whitted | 361/804 |
| 7,149,081 B2 | * | 12/2006 | Chen et al. | 361/679.36 |
| 7,179,991 B2 | * | 2/2007 | Chen et al. | 174/50 |
| 7,345,237 B2 | | 3/2008 | Chen et al. | 174/50 |
| 7,443,669 B2 | * | 10/2008 | Ye et al. | 361/688 |
| 7,782,606 B2 | * | 8/2010 | Baker et al. | 361/679.39 |
| 7,839,629 B2 | * | 11/2010 | Yeh | 361/679.37 |
| 7,859,832 B2 | * | 12/2010 | Hsieh et al. | 361/679.33 |
| 8,213,172 B2 | * | 7/2012 | Sun | 361/679.33 |
| 8,320,118 B2 | * | 11/2012 | Chuang et al. | 361/679.33 |
| 2004/0105229 A1 | * | 6/2004 | Wang et al. | 361/685 |
| 2005/0088815 A1 | * | 4/2005 | Chen et al. | 361/685 |
| 2006/0007650 A1 | * | 1/2006 | Shim | 361/685 |
| 2008/0157638 A1 | * | 7/2008 | Liu et al. | 312/223.2 |
| 2009/0168325 A1 | * | 7/2009 | Yeh et al. | 361/679.33 |
| 2009/0279242 A1 | * | 11/2009 | Yang | 361/679.31 |
| 2009/0279244 A1 | * | 11/2009 | Crippen et al. | 361/679.33 |
| 2010/0020438 A1 | * | 1/2010 | Gross et al. | 360/97.02 |
| 2010/0238624 A1 | * | 9/2010 | Dai | 361/679.33 |
| 2011/0134598 A1 | * | 6/2011 | Hsiao | 361/679.33 |
| 2011/0194236 A1 | * | 8/2011 | Lai et al. | 361/679.02 |
| 2011/0255235 A1 | * | 10/2011 | Chen | 361/679.33 |

* cited by examiner

Primary Examiner — Adrian S Wilson
(74) Attorney, Agent, or Firm — Fenwick & West LLP

(57) ABSTRACT

A retention mechanism is provided for removably securing a smaller sized server or other rack-mounting computing asset into a larger sized server tray and rack, which are larger in width than the computing asset. The tray includes an edge configured to align and couple with the end of one or more clips, which may be removably installed on the tray. The clips include a bowed portion that contacts the surface of the computing asset when installed so as to apply a securing force on the computing asset and into the tray. The resulting friction between the server and the clip and between the server and the tray secures the server in place in the tray.

28 Claims, 3 Drawing Sheets

SERVER RETENTION MECHANISM

BACKGROUND

This invention relates generally to rack-mounted hardware in a data center, and in particular to retention mechanisms for retaining computer servers and other computing assets in larger housings or enclosures within a rack.

In a conventional data center, computer servers and other computing assets are stored and enclosed in server racks. The standard width of a computer server is 19 inches. To hold a standard computer server, therefore, conventional server racks have mounting trays that have a width of 19 inches to secure the server. To install a server in a standard rack, the server is put on one of the trays in the rack, slid into the rack, and then secured to the rack with screws.

This process works for standard sized equipment and racks, but it does not allow for servers and/or racks that are not of the standard size. For example, if the rack were larger than the standard 19-inch server, or if the server to be mounted were smaller than the standard 19-inch rack, or both, the server would not fit well within the rack's tray. It would be difficult to install or mount a server to the frame of a larger server rack because of the difference in widths. When a shelf or tray is used to hold the server in the server rack, the server can move or slide on the tray. Conventional straps or anti-slip mats may not provide the adequate friction for retaining the server on the rack. Thus, there is a need for a system to easily and removably secure servers and other computing assets in larger sized server racks or trays.

SUMMARY

To enable the storage of a server or other computing asset in a compartment of a server rack, where the computing asset is smaller than the asset for which the rack is designed, embodiments of the invention provide a retention mechanism for securing a smaller server in larger server racks and trays. In one embodiment, the server has a standard width of 19 inches, and the width of the server rack is 20 inches. In some embodiments, the tray for retaining the server also has a width of 20 inches. In other embodiments, the widths of the tray and the rack are greater than the standard width of the server.

In one embodiment, the tray has at least two side panels, and the panels have an outer edge with a mechanical interface that is configured to couple with one or more clips. The clips may have a curved or bowed surface in the center of the clip that contacts the surface of the server that is installed in the tray and thus press the server into the tray. The friction between the clip and the server and between the server and the tray provides a static friction force that secures the server in the tray and tends to reduce vibration of the server.

In an embodiment, the clip has two ends configured for coupling with the edges of the tray. The end of the clip may align directly with the edge of the tray. In another embodiment, the end of the clip hooks or otherwise fastens with the edge of the tray. The coupling of the end of the clip and the edge of the tray secures the server in the tray. The coupling of the clip and the tray can be easily released to allow removal of the clip from the tray. In some embodiments, multiple clips can be placed on the tray to secure the server in the tray.

The figures depict various embodiments of the present invention for purposes of illustration only. One skilled in the art will readily recognize from the following discussion that alternative embodiments of the structures and methods illustrated herein may be employed without departing from the principles of the invention described herein.

DETAILED DESCRIPTION

Figure 1:
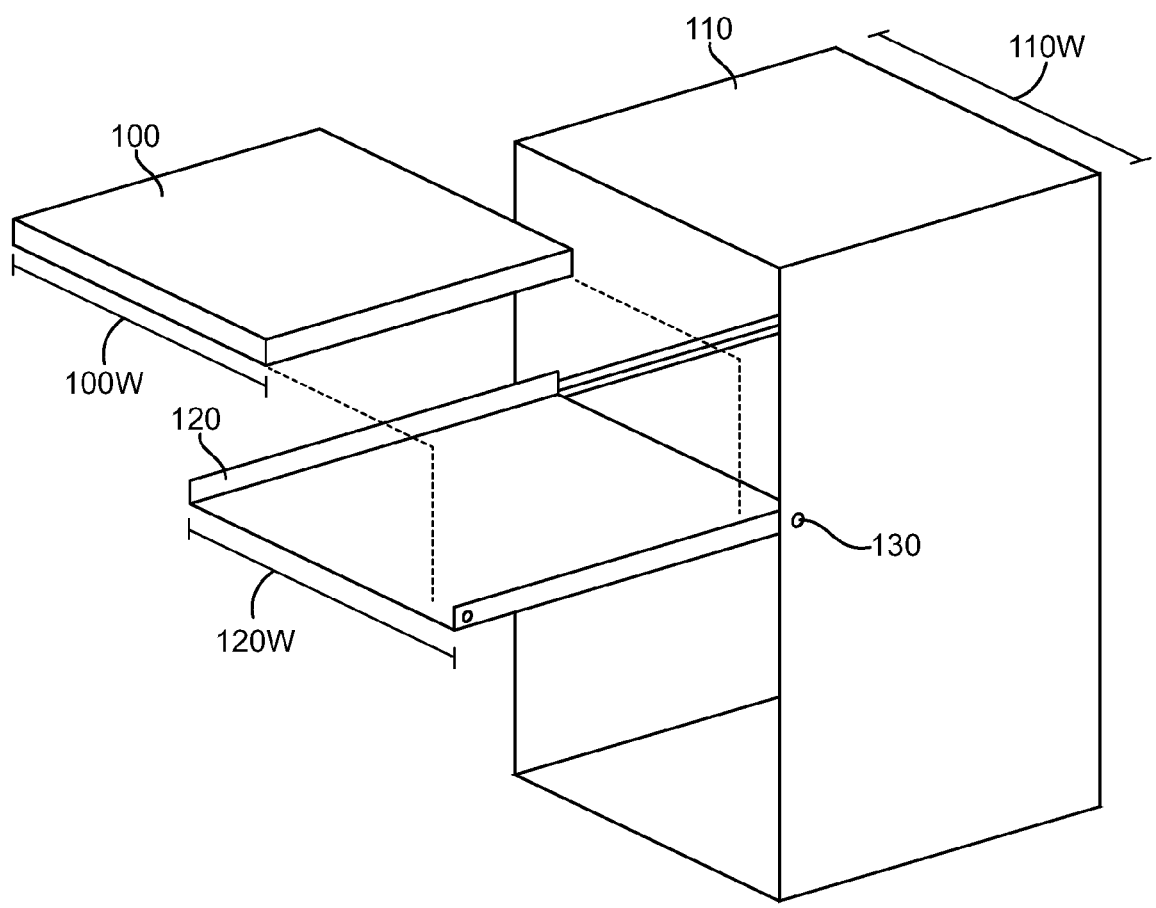
FIG. 1 is a perspective view of a computer server, a tray, and a rack, in accordance with an embodiment of the invention.

Standard-sized computer servers require a retention mechanism for storing the servers on non-standard sized server trays and racks. Referring to FIG. 1, a standard server 100 is shown. A server 100 refers to a computer or device on a network that manages network resources. In some embodiments, a server 100 is a computer dedicated to running one or more services to serve the needs of programs running on other computers on the same network. Standard computer servers 100 have a width 100$w$ of 19 inches.

A computer server can be stored in a rack 110. The rack 110 is a housing or enclosure for the server and can hold a plurality of servers. The rack 110 can also be referred to as a rack-mount, rack-mount instrument, a rack mounted system, a rack mount chassis, a sub-rack, a rack mountable, or a shelf. In some embodiments, the rack 110 has a width 110$w$ that is longer than the standard 19-inch server. In one embodiment, the rack 110 has a width 110$w$ of 20 inches. In other embodiments, the rack 110 has a width 110$w$ that is 1, 2, 3, or more inches longer than the standard 19-inch server.

In some embodiments, a tray 120 is inserted into the rack 110. The tray 120 is used to hold the server 100 in the rack 110. In some embodiments, the tray 120 slides into the rack on rails or a guide. In other embodiments, the tray 120 is mounted or screwed to the rack 110. In another embodiment, the tray 120 is placed on a shelf or on a plurality of extended tabs or panels that hold the tray 120 in the rack 110. The tray 120 can include a base panel, a front panel, a back panel, two side panels, and/or an open end for receiving the server 100. In certain embodiments, the tray 120 has the same width 120$w$ as the rack 110. In another embodiment, the width 120$w$ of the tray 120 is 20 inches. In yet another embodiment, the width 120$w$ of the tray 120 is longer than 19 inches.

Figure 2A:
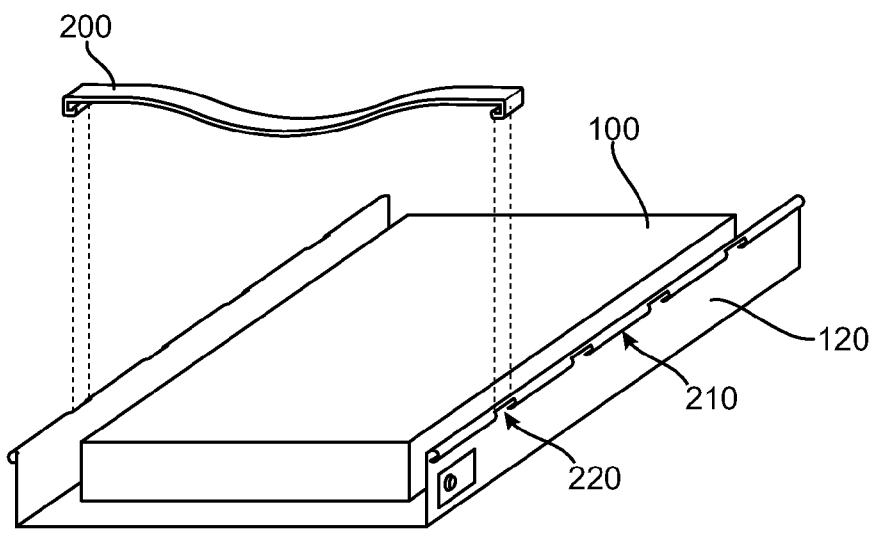
FIG. 2A illustrates the alignment and placement of a clip on a tray with a server, in accordance with an embodiment of the invention.

Referring now to FIG. 2, the server 100 is placed within or on the tray 120. As shown in FIG. 2A, the width of the tray 120 is longer than the width of the server 100. In some embodiments, a clip 200 is placed on the tray 120 over the server 100. In other embodiments, one or more clips 200 are placed over the server 100 and coupled to the tray 120. The clips 200 can be placed at various positions on the tray 120 and coupled to the tray 120.

In some embodiments, the clip 200 has the same width as the tray 120. In one embodiment, the clip 200 is 20 inches long. In another embodiment, the clip 200 is longer than 19 inches. In other embodiments, the clip 200 is configured to fit the width of the tray 120.

FIG. 2A depicts aspects of the tray 120 that are used to retain the server 100 in the tray 120. The side panels of the tray 120 have edges 210 that extend out from the end of the side panel. The edges of the tray can be made of a thick sheet of metal, and the edge 210 of the tray can be curved, rounded, arched, bent, or folded over. In some embodiments, the curved edge 210 of the tray 120 includes one or more slots 220, which designate the locations where a clip 200 should be placed and coupled to the tray 120. The slot 220 can be an indentation, a pocket, or a receiving portion in the edge 210 of the tray 120 that is configured for the placement of the clip 200. In certain embodiments, the edges of the clip 200 fit exactly into the slot 220. In other embodiments, the slot 220 is slightly larger than the width of the clip 200. In one embodiment, two slots 220 are located at the same position on opposite sides of the tray 120 to receive the ends of a clip 200. A tray 120 can have one or more slots 220 for receiving one or more clips 200.

Figure 2B:
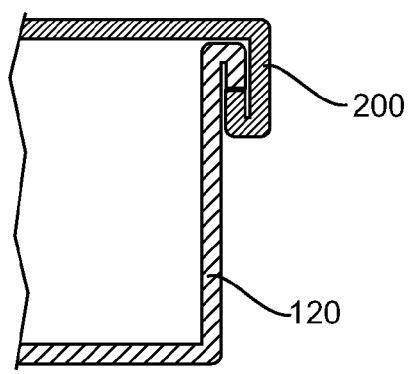
FIG. 2B illustrates a configuration of the coupling between a tray and a clip, in accordance with an embodiment of the invention.
Figure 2C:
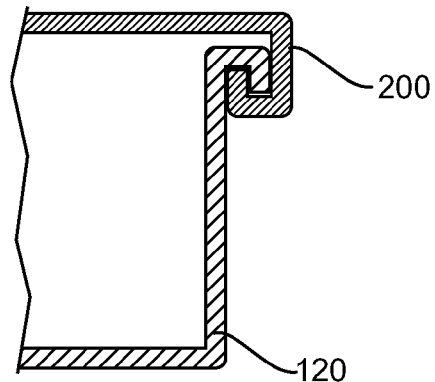
FIG. 2C illustrates a configuration of the coupling between a tray and a clip, in accordance with an embodiment of the invention.

In some embodiments, the ends of the clip 200 couple with the edges of the tray 120. The ends of the clip can meet up with the edges of the tray such that their cross sectional surfaces meet face-to-face. As shown in FIG. 2B, the end of the clip 200 can be directly aligned with the edge of the tray 120, according to one embodiment. In this configuration, the end of the clip 200 faces directly with the edge of the tray 120, and the contact between the end of the clip 200 and the edge of the tray 120 creates a friction that secures the clip to the tray. In another embodiment, the end of the clip 200 couples with the edge of the tray 120 in a locked, fastened, or hooked configuration, as shown in FIG. 2C. The contact between the edges of the tray 120 and the clip 200 create a friction fit that retains the clip 200 on the tray 120. When appropriate, the clip 200 can be easily uncoupled or detached from the tray 120 by moving or releasing the end of the clip 200 from the coupled position with the edge of the tray 120.

Various other configurations and designs of the end of the clip 200 and edge of the tray 120 can be used to secure the clip 200 to the tray 120. One of skill in the art may alter the configurations of the clip 200 and tray 120 without departing from the spirit and scope of the invention.

Figure 3A:
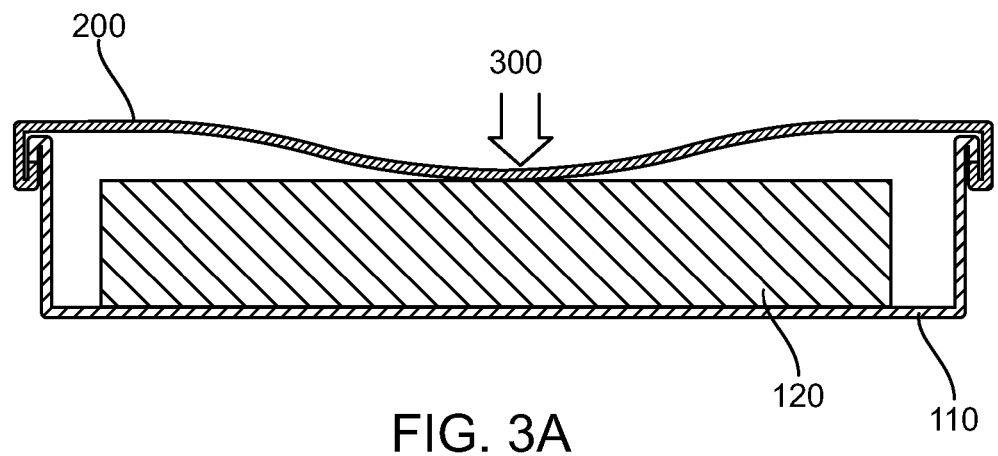
FIG. 3A is a side cut-out view of the retention mechanism comprising the clip, tray, and server, in accordance with an embodiment of the invention.
Figure 3B:
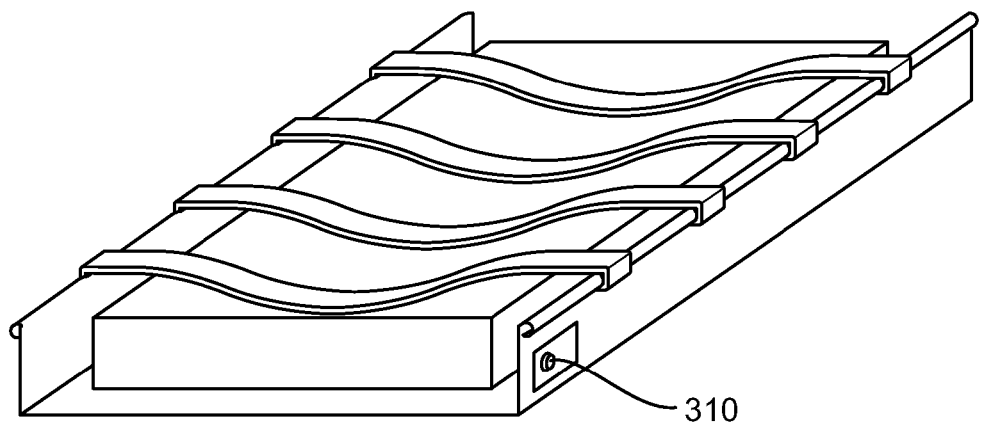
FIG. 3B is a perspective view of the retention mechanism comprising a plurality of clips on a tray holding a server, in accordance with an embodiment of the invention.

Referring now to FIG. 3, the server 100 is secured within the tray 120 by the placement of the clip 200 on top of the server. As shown in FIG. 3A, the clip 200 has a bowed or curved design in the middle portion of the clip 200, according to one embodiment. The bowed section 300 of the clip 200 comes into direct contact with the surface of the server 100. The contact between the surfaces of the bowed center 300 of the clip 200 and the exterior surface of the server 100 creates a friction sufficient to prevent the server 100 from moving or sliding in the tray 120. As shown in FIG. 3B, multiple clips 200 can be placed on the tray 120 to increase the amount of friction and contact between the server 300 and the tray 120 and to more tightly secure the server 300 in the tray 120. One of skill in the art may alter the shape of the clip 200 and number of clips 200 without departing from the spirit and scope of the invention.

In some embodiments, the tray 120 is secured to the rack 110 using a protruding notch 310 on the side of the tray 120. The notch 310 is positioned on the side panel of the tray 120 and aligns with an opening 130 in the side of the rack 110. The notch 310 inserts into the opening 130 and prevents movement of the tray 120 in the rack 110. To release the tray 120 from the rack 100, the notch 310 is removed from the opening 130. The notch 310 and the opening 130 are used to easily secure and release the tray 120 from the rack 110. Various other types of notches or openings can be used to secure and release the tray 120 from the rack 110.

The foregoing description of the embodiments of the invention has been presented for the purpose of illustration; it is not intended to be exhaustive or to limit the invention to the precise forms disclosed. Persons skilled in the relevant art can appreciate that many modifications and variations are possible in light of the above disclosure.

Moreover, the language used in the specification has been principally selected for readability and instructional purposes, and it may not have been selected to delineate or circumscribe the inventive subject matter. It is therefore intended that the scope of the invention be limited not by this detailed description, but rather by any claims that issue on an application based hereon. Accordingly, the disclosure of the embodiments of the invention is intended to be illustrative, but not limiting, of the scope of the invention, which is set forth in the following claims.

What is claimed is:

1. A system for retaining a rack-mounted computer server on a rack, the system comprising:
a server for use in a computing system and having a width;
a tray for retaining the server, the tray having a width greater than the width of the server and having at least two opposing panels, each of the at least two opposing panels comprising a flat end, each flat end having a planar edge, both flat ends having a thickness, and each flat end curling back onto itself so that its planar edge is facing downwards when the server is secured in the tray and the surface plane of the edge being perpendicular to the flat end;
a clip for securing the server in the tray, the clip having a bent middle section and two flat ends, each flat end of the clip having a planar edge and a thickness, the thickness of the clip's flat ends being the same as the thickness of the tray's flat ends, wherein when the server is placed in the tray and the clip is secured to the tray the bent middle section presses against the server and is being deformed away from the tray by the server to prevent the server from being dislodged from the tray;
a first and second bend for each flat end of the clip, the second bend comprising the flat end of clip curling back onto itself so that its planar edge is facing upwards when the server is secured in the tray and the surface plane of the edge being perpendicular to the flat end, wherein when the clip is removably secured to the tray each planar edge of the clip's flat ends mates with the planar edge of the tray's flat ends and their respective thickness match up against each other; and
a rack for housing the tray and the server.

2. The system of claim 1, wherein the rack has a width greater than 19 inches.

3. The system of claim 1, wherein the rack has a width of 20 inches.

4. The system of claim 1, wherein the tray has a width of 20 inches.

5. The system of claim 1, wherein each opposing panel of the tray comprises one or more slots for placement of the clip.

6. The system of claim 1, wherein the edge of the tray directly aligns with the end of the clip when the clip is secured to the tray.

7. The system of claim 1, wherein the edge of the tray is configured to hook with the end of the clip when the clip is secured to the tray.

8. The system of claim 1, further comprising at least four or more clips for securing the server in the tray, each clip having a bent middle section, wherein when the server is placed in the tray and each clip is secured to the tray the bent middle section of each clip press against the server and is being deformed away from the tray by the server to prevent the server from being dislodged from the tray.

9. The system of claim 1, further comprising a notch on the tray that is configured to align with and insert into an opening in the rack to releasably secure the tray to the rack.

10. The system of claim 9, wherein the notch can be removed from the opening to release the tray from the rack.

11. A system for retaining a rack-mounted computing asset in a rack, the system comprising:
   a tray for retaining a computing asset, the tray having a width greater than the width of the computing asset and having at least two opposing panels, each of the at least two opposing panels comprising flat end, each flat end having a planar edge, both flat ends having a thickness, and each flat end curling back onto itself so that its planar edge is facing downwards when the computing asset is secured in the tray and the surface plane of the edge being perpendicular to the flat end;
   a clip for securing the computing asset in the tray, the clip having a bent middle surface and two flat ends, each flat end of the clip having a planar edge and a thickness, the thickness of the clip's flat ends being the same as the thickness of the tray's flat ends, so that when the computing asset is placed in the tray and the clip is secured to the tray the bent middle surface presses against the computing asset and is being deformed away from the tray by the computing asset to prevent the computing asset from being dislodged from the tray;
   a first and second bend for each flat end of the clip, the second bend comprising the flat end of clip curling back onto itself so that its planar edge is facing upwards when the computing asset is secured in the tray and the surface plane of the edge being perpendicular to the flat end, wherein when the clip removably secured to the tray each planar edge of the clip's flat ends mates with the planar edge of the tray's flat ends and their respective thickness match up against each other; and
   a housing for the tray and the computing asset, the housing configured to receive the tray and having a width greater than the width of the computing asset.

12. The system of claim 11, wherein the edges of the tray are configured to directly align and removably couple with the ends of the clip.

13. The system of claim 11, wherein the edges of the tray are configured to removably fasten with the ends of the clip.

14. The system of claim 11, wherein the edges of the tray comprise one or more slots for placement of the clip.

15. The system of claim 11, further comprising multiple clips for securing the computing asset in the tray.

16. The system of claim 11, further comprising a notch on the tray that is configured to align with and insert into an opening in the rack to releasably secure the tray to the rack.

17. The system of claim 16, wherein the notch can be removed from the opening to release the tray from the rack.

18. A method for installing a rack-mounted computing asset on a rack, the method comprising:
   for each of a plurality of rack-mounted computing assets to be installed in a rack:
      placing the computing asset into a tray, the tray having at least two opposing panels, each of the at least two opposing panels comprising a flat end, each flat end having a planar edge, both flat ends having a thickness, and each flat end curling back onto itself so that its planar edge is facing downwards when the computing asset is secured in the tray and the surface plane of the edge being perpendicular to the flat end;
      installing one or more clips onto the tray, wherein each clip has two flat ends that comprise:
         a planar edge,
         a first and second bend, the second bend comprising the flat end of clip curling back onto itself so that its planar edge is facing upwards when the computing asset is secured in the tray and the surface plane of the edge being perpendicular to the flat end, and when the clip is installed onto the tray each planar edge of the clip's flat ends mates with the planar edge of the tray's flat ends and their respective thickness match up against each other, and
         a thickness, the thickness of the clip's flat ends being the same as the thickness of the tray's flat ends, and
      each clip has a bent middle section that when the computing asset is placed in the tray and each clip is installed onto the tray presses against the computing asset and is being deformed away from the tray by the computing asset to prevent the computing asset from being dislodged from the tray; and
   fixing the tray within the rack.

19. The method of claim 18, wherein the edge of the tray directly aligns with the end of the clip when the clip is secured to the tray.

20. The system of claim 18, wherein the edge of the tray is configured to hook with the end of the clip when the clip is secured to the tray.

21. The system of claim 18, further comprising installing at least four or more clips onto the tray to secure the computing asset in the tray.

22. The system of claim 18, further comprising aligning and inserting a notch on the side of the tray into an opening in the rack to releasably secure the tray to the rack.

23. The system of claim 22, further comprising removing the notch from the opening to release the tray from the rack.

24. The system of claim 1, wherein the ends of the clip are identical and the width of the planar surface of the clip's flat ends that are in contact with the edges of the tray's flat ends spans the entire width of the clip.

25. The system of claim 1, wherein the clip has an approximately symmetric shape.

26. The system of claim 1, wherein the clip comprises a single sheet, the single sheet being punched out a metal sheet and bent to form the bent middle section, wherein the single sheet is substantially free of any cutouts if flattened.

27. The system of claim 1, wherein the edges comprise a sheet of metal and are made by bending the top of each opposing panel to form a protrusion that extends outwards from the opposing panel.

28. A system for retaining a rack-mounted computer server on a rack, the system comprising:
   a server for use in a computing system and having a width;
   a tray for retaining the server, the tray having at least two opposing panels, each of the at least two opposing panels comprising flat end, each flat end having a planar edge, both flat ends having a thickness, and each flat end curling back onto itself so that its planar edge is facing downwards when the server is secured in the tray and the surface plane of the edge being perpendicular to the flat end;
   a plurality of clips for securing the server in the tray, each clip having two flat ends, the two flat ends of the clips being identical and having a planar edge and a thickness, the thickness of the clip's flat ends being the same as the thickness of the tray's flat ends;

a first and second bend for each flat end of the clips, the second bend comprising the flat end of clips curling back onto itself so that its planar edge is facing upwards when the server is secured in the tray and the surface plane of the edge being perpendicular to the flat end, wherein when the clips removably secured to the tray each planar edge of the clips' flat ends mates with the planar edge of the tray's flat ends and their respective thickness match up against each other;

a rack for housing the tray and the server; and a notch on the tray that is configured to align with and insert into an opening in the rack to releasably secure the tray to the rack, the notch configured to be removed from the opening to release the tray from the rack.

* * * * *